(12) United States Patent　(10) Patent No.: US 8,970,004 B2
Zhang et al.　(45) Date of Patent: Mar. 3, 2015

(54) ELECTROSTATIC DISCHARGE DEVICES FOR INTEGRATED CIRCUITS

(71) Applicants: STMicroelectronics, Inc., Coppell, TX (US); International Business Machines Corporation, Armonk, NY (US)

(72) Inventors: John H. Zhang, Fishkill, NY (US); Lawrence A. Clevenger, LaGrangeville, NY (US); Carl Radens, LaGrangeville, NY (US); Yiheng Xu, Hopewell Junction, NY (US)

(73) Assignees: STMicroelectronics, Inc., Coppell, TX (US); International Business Machines Corporation, Armonk, NY (US)

( * ) Notice: Subject to any disclaimer, the term of this patent is extended or adjusted under 35 U.S.C. 154(b) by 63 days.

(21) Appl. No.: 13/725,666

(22) Filed: Dec. 21, 2012

(65) Prior Publication Data

US 2014/0175610 A1　Jun. 26, 2014

(51) Int. Cl.
*H01L 29/00* (2006.01)
*H01L 27/02* (2006.01)
*H01L 21/266* (2006.01)

(52) U.S. Cl.
CPC .......... *H01L 27/0248* (2013.01); *H01L 21/266* (2013.01)
USPC ........... 257/546; 257/173; 257/355; 257/544; 257/E29.019

(58) Field of Classification Search
CPC .............. H01L 21/266; H01L 27/0248; H01L 21/26513; H01L 21/26586; H01J 2237/31711
USPC ................... 257/173, 355, 544, 546, E29.019
See application file for complete search history.

(56) References Cited

U.S. PATENT DOCUMENTS

| | | | | |
|---|---|---|---|---|
| 2008/0174924 | A1* | 7/2008 | Kang et al. | 361/56 |
| 2009/0206367 | A1* | 8/2009 | Gauthier et al. | 257/173 |
| 2013/0075864 | A1* | 3/2013 | Otake et al. | 257/577 |

* cited by examiner

*Primary Examiner* — Andy Huynh
(74) *Attorney, Agent, or Firm* — Seed IP Law Group PLLC (57) ABSTRACT

A junction diode array is disclosed for use in protecting integrated circuits from electrostatic discharge. The junction diodes integrate symmetric and asymmetric junction diodes of various sizes and capabilities. Some of the junction diodes are configured to provide low voltage and current discharge via un-encapsulated interconnecting wires, while others are configured to provide high voltage and current discharge via encapsulated interconnecting wires. Junction diode array elements include p-n junction diodes and N+/N++ junction diodes. The junction diodes include implanted regions having customized shapes. If both symmetric and asymmetric diodes are not needed as components of the junction diode array, the array is configured with isolation regions between diodes of either type. Some junction diode arrays include a buried oxide layer to prevent diffusion of dopants into the substrate beyond a selected depth.

18 Claims, 10 Drawing Sheets

ELECTROSTATIC DISCHARGE DEVICES FOR INTEGRATED CIRCUITS

BACKGROUND

1. Technical Field

The present disclosure relates to the fabrication of integrated circuit diodes used as electrostatic discharge devices.

2. Description of the Related Art

Electrostatic discharge (ESD) occurs in a dielectric, or non-conducting, medium when an accumulation of electrostatic charge creates a voltage that exceeds the breakdown voltage of the medium. The discharge causes a sudden current to flow, dissipating the accumulated charge. Examples include a lightning discharge across an air gap, an arc between two adjacent insulated current-carrying wires, and breakdown of a capacitive structure such as a field effect transistor (FET), which includes an ultra-thin gate dielectric.

It is common for human beings to cause an ESD by simply touching an electronic device. Because integrated circuit components are so tiny, they are particularly vulnerable to damage from ESD. ESD protection devices can be deployed on board an integrated circuit chip, to protect electronic components (e.g., transistors) against static discharge events. ESD devices can incorporate diodes to block high voltages (e.g., up to about 10,000 V) and currents from reaching the electronic components, and resistors to dissipate power before it reaches the components of interest. ESD devices can also act as lightning rods to direct high currents away from the circuits to an on-board ground connection, typically established at the periphery of an integrated circuit chip. ESD devices are often located, for example, underneath bond pads, or near power supplies.

One example of an ESD device within an integrated circuit is a simple p-n junction diode that acts like a fuse. If the characteristic threshold voltage of the diode is set to be slightly smaller than the maximum voltage that can be sustained by circuit components, the diode can protect those components. When the diode threshold voltage is exceeded by a localized buildup of electrostatic charge, the diode turns on and provides a conducting path to short out the excess voltage.

Design and manufacture of effective ESD devices on board integrated circuit chips becomes increasingly challenging with each new technology generation, as device dimensions continue to shrink.

BRIEF SUMMARY

A junction diode array for use in protecting integrated circuits from ESD can be fabricated to integrate symmetric and/or asymmetric junction diodes of various sizes and capabilities. Some of the junction diodes can be configured to provide low voltage and current discharge via unencapsulated interconnecting wires (e.g., contacts), while others can be configured to provide high voltage and current discharge via encapsulated interconnecting wires. The junction diode array can include, for example, p-n junction diodes, or N+/N++ junction diodes. The use of tilted implants in fabricating the junction diode array allows a single implant hard mask to be used to implant multiple ion species. Furthermore, a different implant tilt angle can be chosen for each species, along with other parameters, (e.g., implant energy, implant mask thickness, and dimensions of the mask openings) so as to craft the shape of the implanted regions.

If both symmetric and asymmetric diodes are not needed as components of the junction diode array, isolation regions can be inserted between already formed diodes of either type. A buried oxide layer can also be used to prevent diffusion of dopants into the substrate beyond a selected depth.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Unless the context requires otherwise, throughout the specification and claims that follow, the word "comprise" and variations thereof, such as "comprises" and "comprising" are to be construed in an open, inclusive sense, that is, as "including, but not limited to."

Reference throughout the specification to "one embodiment" or "an embodiment" means that a particular feature, structure, or characteristic described in connection with the embodiment is included in at least one embodiment. Thus, the appearance of the phrases "in one embodiment" or "in an embodiment" in various places throughout the specification are not necessarily all referring to the same aspect. Furthermore, the particular features, structures, or characteristics may be combined in any suitable manner in one or more aspects of the present disclosure.

Reference throughout the specification to integrated circuits is generally intended to include integrated circuit components built on semiconducting substrates, whether or not the components are coupled together into a circuit or able to be interconnected.

Reference throughout the specification to insulating materials or semiconducting materials can include various materials other than those used to illustrate specific embodiments of the transistor devices presented. The term "epitaxial silicon compounds" should not be construed narrowly to limit an epitaxially grown structure to Si or SiGe, for example, but rather, the term "epitaxial silicon compounds" is broadly construed to cover any compounds that can be grown epitaxially from a crystalline silicon surface.

Reference throughout the specification to conventional thin film deposition techniques for depositing silicon nitride, silicon dioxide, metals, or similar materials include such processes as chemical vapor deposition (CVD), low-pressure chemical vapor deposition (LPCVD), metal organic chemical vapor deposition (MOCVD), plasma-enhanced chemical vapor deposition (PECVD), plasma vapor deposition (PVD), atomic layer deposition (ALD), molecular beam epitaxy (MBE), electroplating, electro-less plating, and the like. Specific embodiments are described herein with reference to examples of such processes. However, the present disclosure and the reference to certain deposition techniques should not be limited to those described. For example, in some circumstances, a description that references CVD may alternatively be done using PVD, or a description that specifies electroplating may alternatively be accomplished using electro-less plating. Furthermore, reference to conventional techniques of thin film formation may include growing a film in-situ. For example, in some embodiments, controlled growth of an oxide to a desired thickness can be achieved by exposing a silicon surface to oxygen gas or to moisture in a heated chamber.

Reference throughout the specification to conventional photolithography techniques, known in the art of semiconductor fabrication for patterning various thin films, include a spin-expose-develop process sequence involving a photoresist. Such a photolithography sequence entails spinning on the photoresist, exposing areas of the photoresist to ultraviolet light through a patterned mask, and developing away exposed (or alternatively, unexposed) areas of the photoresist, thereby transferring a positive or negative mask pattern to the photoresist. The photoresist mask can then be used to etch the mask pattern into one or more underlying films. Typically, a photoresist mask is effective if the subsequent etch is relatively shallow, because photoresist is likely to be consumed during the etch process. Otherwise, the photoresist can be used to pattern a hard mask, which, in turn, can be used to pattern a thicker underlying film.

Reference throughout the specification to conventional etching techniques known in the art of semiconductor fabrication for selective removal of polysilicon, silicon nitride, silicon dioxide, metals, photoresist, polyimide, or similar materials include such processes as wet chemical etching, reactive ion (plasma) etching (RIE), washing, wet cleaning, pre-cleaning, spray cleaning, chemical-mechanical planarization (CMP) and the like. Specific embodiments are described herein with reference to examples of such processes. However, the present disclosure and the reference to certain deposition techniques should not be limited to those described. In some instances, two such techniques may be interchangeable. For example, stripping photoresist may entail immersing a sample in a wet chemical bath or, alternatively, spraying wet chemicals directly onto the sample.

Specific embodiments are described herein with reference to examples of ESD diode array structures that have been produced; however, the present disclosure and the reference to certain materials, dimensions, and the details and ordering of processing steps are exemplary and should not be limited to those shown.

In the figures, identical reference numbers identify similar features or elements. The sizes and relative positions of the features in the figures are not necessarily drawn to scale.

Figure 1:
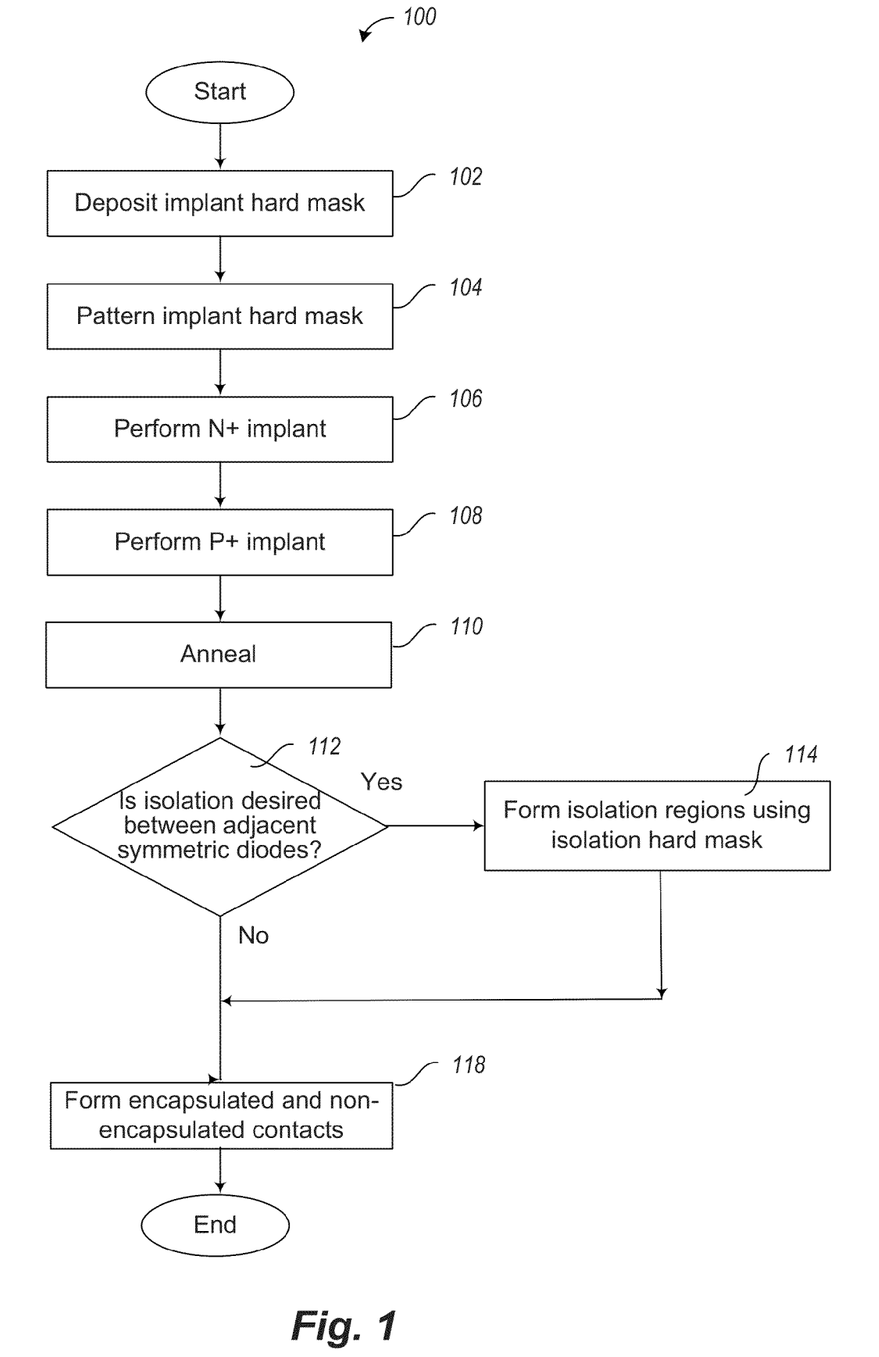
FIG. 1 is a high level flow diagram summarizing the process for fabricating electrostatic discharge devices, as described herein.

FIG. 1 presents a high-level process flow 100 that outlines basic actions in a semiconductor fabrication process that can be used to create integrated junction diode arrays as described below and shown in FIGS. 2-10.

At 102, an implant hard mask is deposited, and subsequently patterned at 104. The implant hard mask can be used to implant multiple species of ions. For example, negative and positive ions can be implanted sequentially through the same implant hard mask at 106 and 108, respectively, using different tilted implant angles for the different ion species. A diode array is thus produced that includes both symmetric and asymmetric p-n junction diodes. Following implantation of both species, the implant hard mask can be removed at 110, and the device can be annealed at 112 to diffuse the dopants and re-crystallize the substrate.

If it is decided at 112 that electrical isolation is desired between adjacent symmetric diodes, for example, a processing sequence 114 can be executed to insert an insulating material between the already formed symmetric diodes. The processing sequence 114 is described in further detail below, with reference to FIGS. 6A and 6B. The electrical isolation can be accomplished using either a separate isolation hard mask, or by trimming and re-using the implant hard mask as an isolation hard mask.

Finally, encapsulated and/or unencapsulated contacts can be formed at 118 to provide a conduction path for electrical signals to and from the diode array. Encapsulated contacts are appropriate for larger wires that provide high voltage and high current electrostatic discharge protection. (The step 118 is detailed further below with reference to FIGS. 7A and 7B.)

Figure 2:
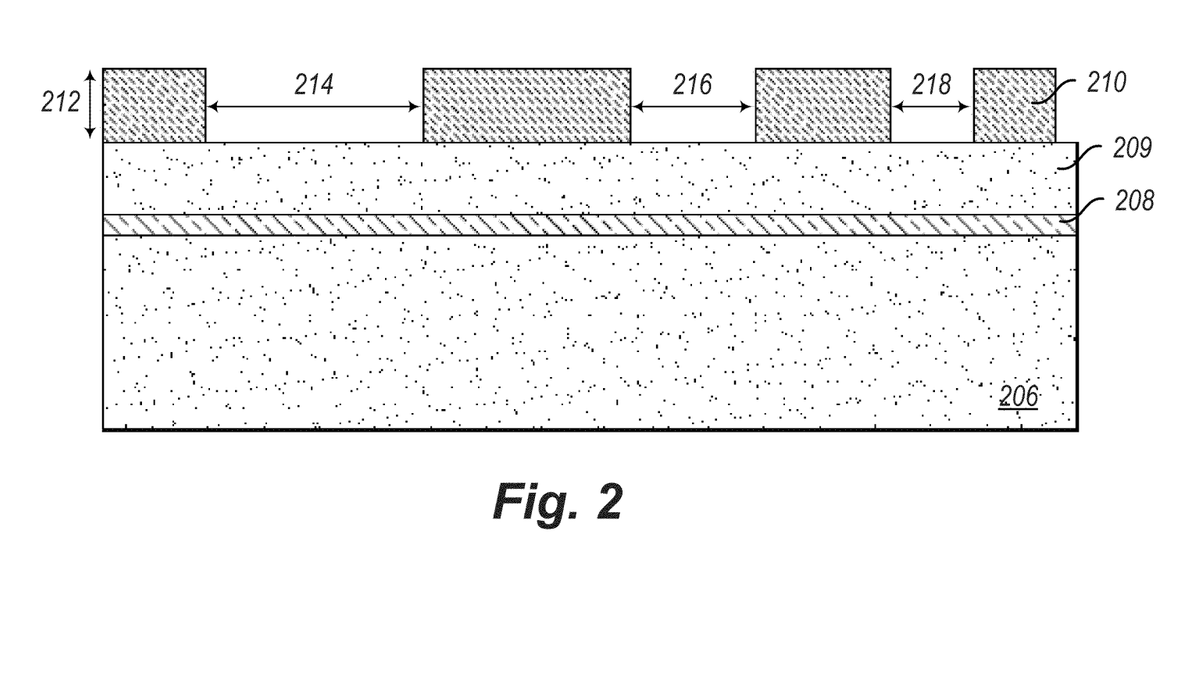
FIG. 2 is a side view of a patterned implant hard mask for use in implanting ions into a silicon substrate.

FIG. 2 shows an exemplary silicon substrate 206 in which a buried oxide layer 208 has been formed. The buried oxide layer 208 can have a thickness within the range of about 5-30 nm. Above the buried oxide layer 208, an active region 209 of the silicon substrate can have a thickness in the range of about 20-80 nm. An implant hard mask 210, having an implant hard mask thickness 212, is shown patterned on the surface of the silicon substrate 206. The thickness 212 can be in the range of about 5-50 nm. The implant hard mask 210 can be made of, for example, silicon nitride. The implant hard mask 210 can have mask openings of graduated sizes, such as a large mask opening 214, an intermediate-sized mask opening 216, and a small mask opening 218.

At 102, the silicon nitride implant hard mask 210 can be deposited using conventional deposition methods such as, for example, low-pressure chemical vapor deposition (LPCVD).

At 104, the silicon nitride implant hard mask 210 can be patterned using a photoresist mask, conventional optical (e.g., ultraviolet (UV), or deep ultraviolet) photolithography, and a conventional silicon nitride etching method that is selective to the underlying silicon substrate 206 (e.g., a plasma etch, or silicon nitride removal in a hot phosphoric acid bath ($H_3PO_4$)).

Figure 3:
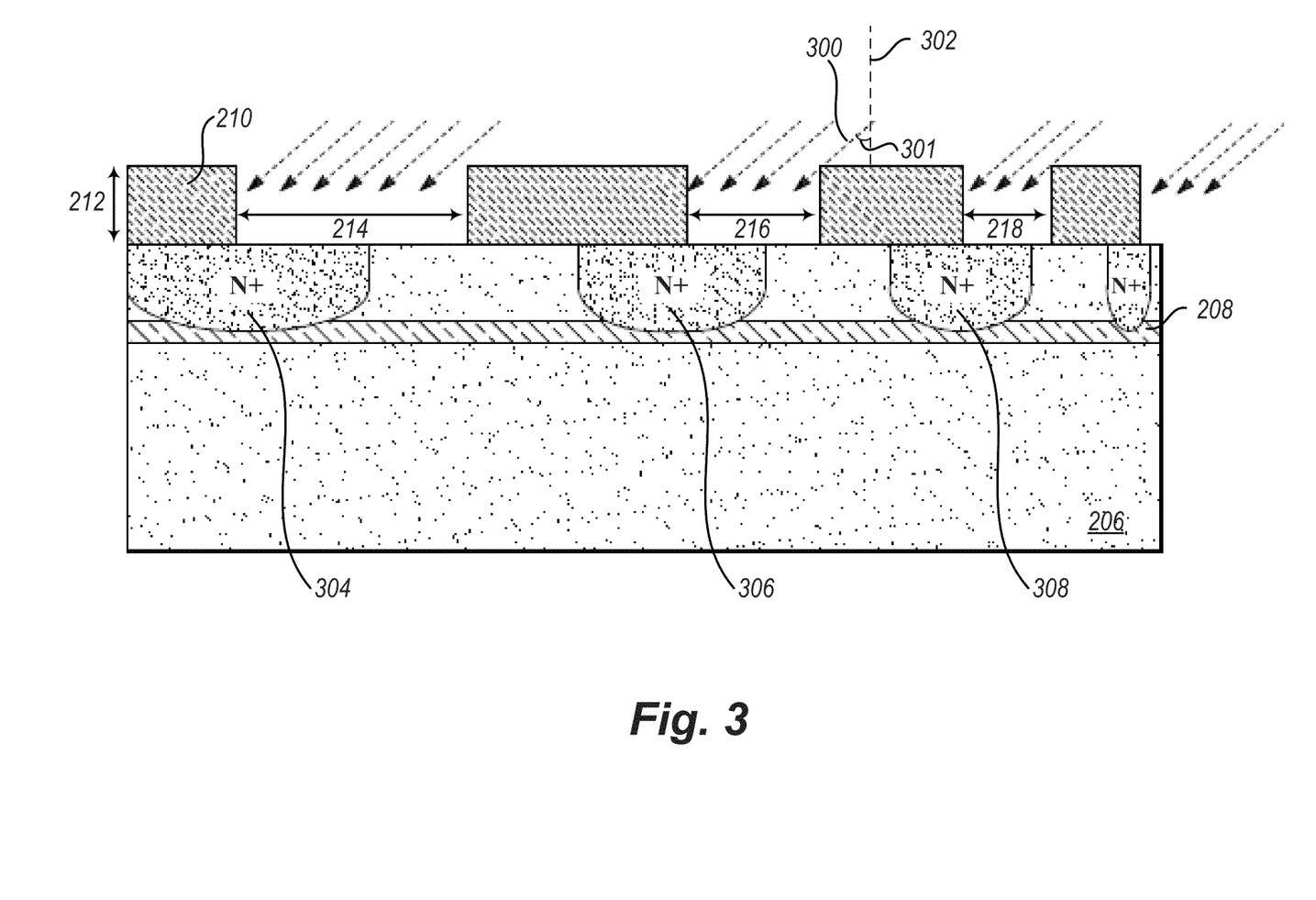
FIG. 3 is a side view illustrating tilted implantation of negatively charged ions through the hard mask shown in FIG. 2.

FIG. 3 illustrates a first ion implantation step in which negative ions (e.g., arsenic or phosphorous) can be implanted through the graduated openings in the silicon nitride implant hard mask 210.

During implantation at 106, the negative ions follow a tilted trajectory 300 at a selected angle 301 to a silicon surface normal 302. Negative ions directed along the tilted trajectory 300 through the large mask opening 214 are implanted below the silicon surface, creating a large negatively doped (N+) region 304. Similarly, negative ions directed along a parallel tilted trajectory that passes through the intermediate-sized mask opening 216 are implanted below the silicon surface to create an intermediate-sized N+ region 306. Negative ions directed along a parallel trajectory that passes through the small mask opening 218 are implanted below the silicon surface, creating a small N+ region 308.

Figure 4:
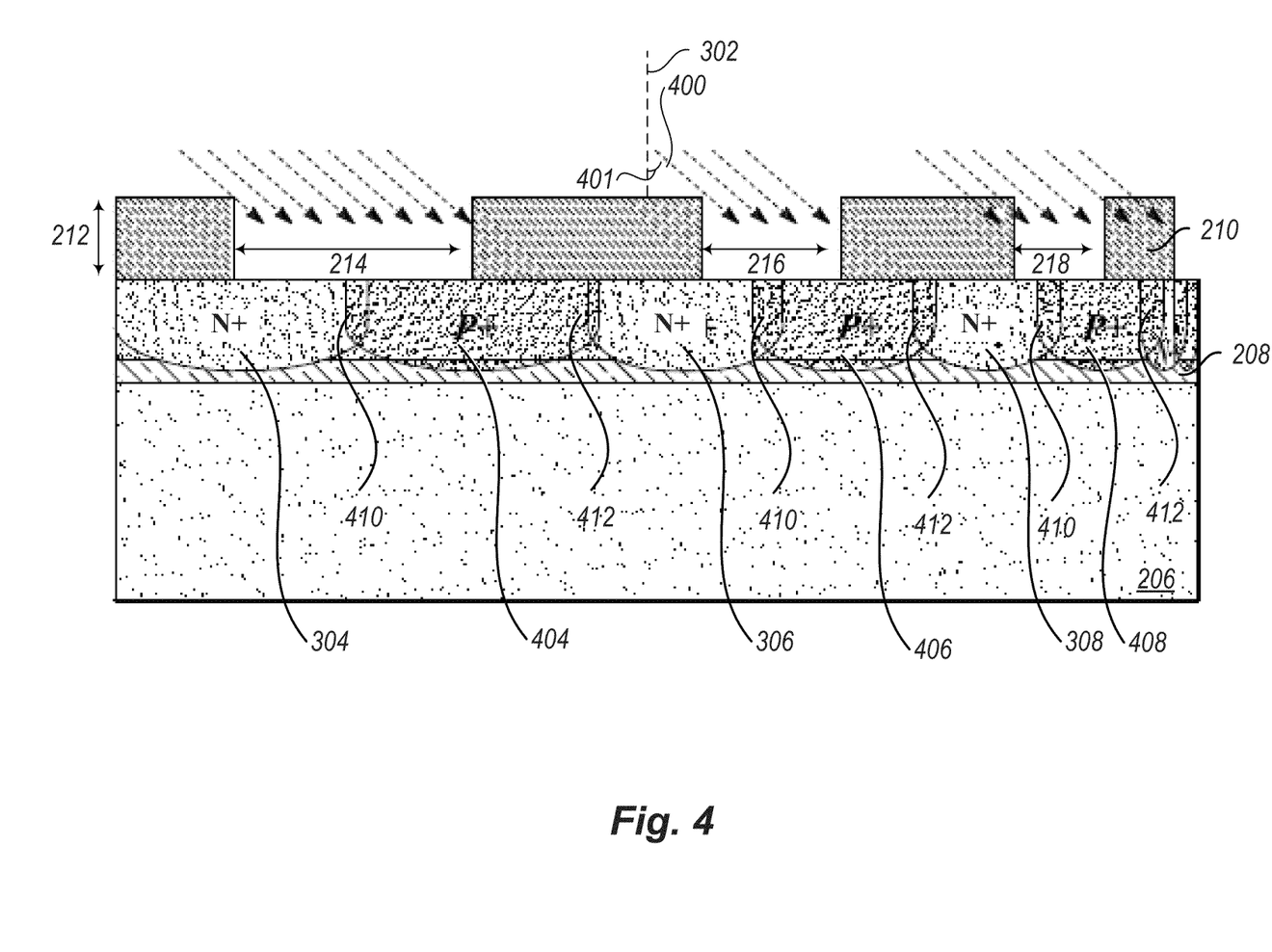
FIG. 4 is a side view illustrating tilted implantation of positively charged ions through the hard mask shown in FIG. 2.

FIG. 4 illustrates a second ion implantation step in which positive ions (e.g., boron) can be implanted through the graduated openings in the silicon nitride implant hard mask 210. In accordance with the embodiments herein, the same silicon nitride implant hard mask 210 can be used for the first (N+) and second (P+) ion implantation process steps.

During implantation at 108, the positive ions follow a tilted trajectory 400 at a selected angle 401 to the silicon surface normal 302. The angle 401 is desirably rotated about 90 degrees with respect to the angle 301, so as to direct positive ions to be implanted into regions 404, 406, and 408, located in-between the established N+ regions, 304, 306, and 308 to form alternating P+ and N+ doped regions. Positive ions directed along the tilted trajectory 300 that passes through the large mask opening 214 are implanted below the silicon surface, creating the large positively-doped (P+) region 404. Similarly, positive ions directed along a parallel tilted trajectory that passes through the intermediate-sized opening 216 are implanted below the silicon surface to create the intermediate-sized P+ region 406. Positive ions directed along a parallel tilted trajectory that passes through the small mask opening 218 are implanted below the silicon surface, creating the small P+ region 408.

Overlap regions that contain both negative dopants and positive dopants form a set of wide p-n diode junctions 410 and narrow p-n diode junctions 412. The wide p-n diode junctions 410 are substantially centered underneath each of the mask openings 214, 216, and 218, while the narrow p-n diode junctions 412 are substantially centered underneath portions of the implant hard mask 210. Alternatively, the implant hard mask can be patterned in the opposite fashion, or the implant order can be reversed, resulting in the narrow p-n junctions 412 being exposed and the wide p-n junctions 410 being covered. The widths of the p-n diode junctions 410 and 412 can be varied to change operational properties of the diodes. Process variables that influence the shape, size, and position of the implanted regions and the junctions within the overlap regions include the tilted implant angles 301 and 401, the implant hard mask thickness 212, and implant energies used during the implantation steps.

At 110, after the second ion implantation step is complete, the silicon nitride implant hard mask 210 can be removed using a standard removal process, such as silicon nitride removal in a hot phosphoric acid bath, which is highly selective to the underlying doped silicon. Alternatively, the implant hard mask 210 can be retained for further use in subsequent process steps a, as described below.

Following the ion implantation steps, at 110 an annealing process may be used to heal the crystalline structure of the silicon substrate 206 from damage created by ion bombardment. Annealing may entail, for example, heating the doped silicon substrate 206 to a high temperature, for example, within the range of about 800 C-1100 C. The annealing process tends to cause lateral diffusion of positive and negative dopants beyond the initial boundaries of the implanted regions, while downward diffusion of the implanted N+ and P+ dopants is blocked by the buried oxide layer 208. Thus, the buried oxide layer 108 provides a diffusion barrier that determines the depth of the doped regions. As mentioned above, the buried oxide layer 208 can be located in the range of about 20-80 nm below the surface of the silicon substrate 206. The annealing process, as well as the selection of process variable values, therefore can be adjusted to refine dimensions of a resulting p-n junction diode array 500 shown in FIG. 5.

Figure 5:
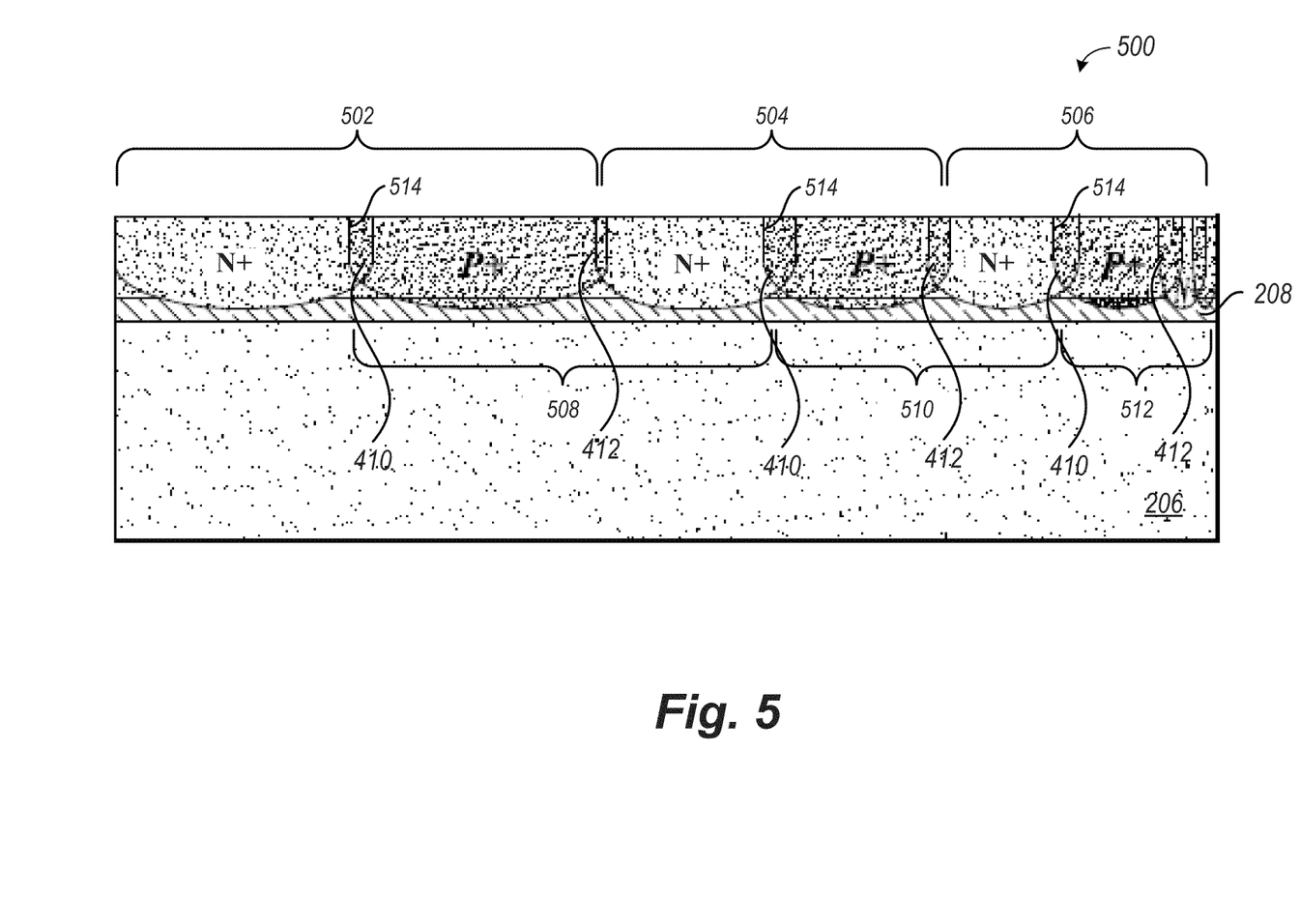
FIG. 5 is a side view of a completed array of p-n junction diodes having graduated widths.

FIG. 5 further illustrates different diode configurations present in the p-n junction diode array 500. Specifically, symmetric diodes 502, 504, and 506 each have N+ and P+ doped regions that are substantially matched in size, and include the wide p-n diode junctions 410. The symmetric diode 502, being the largest, can be configured to provide high voltage and current discharge, whereas the small symmetric diode 506 can be configured to provide low voltage and current discharge. Asymmetric diodes 508, 510, and 512 have N+ and P+ regions that differ in size, in which the asymmetric diodes in FIG. 5 are characterized by P+ regions that exceed the size of the N+ regions. Such asymmetric diodes generally include the narrow p-n diode junctions 412.

Figure 6A:
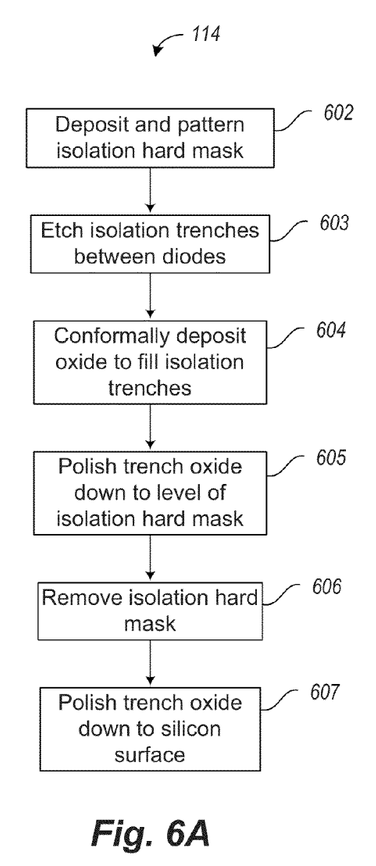
FIG. 6A is a process flow diagram showing a sequence of process steps that can be used to insert isolation regions between symmetric diodes shown in FIG. 5, according to an exemplary embodiment.

With reference to FIGS. 6A-6D, if it is determined at a decision point 112 that asymmetric diodes are not desired, an alternative, isolated symmetric diode array structure 600 (FIG. 6D) can be built at 114 (FIG. 6A), according to a more detailed processing sequence in which isolation regions 602 are inserted between the already formed symmetric diodes 502, 504, and 506. FIG. 6A shows the step 114 in further detail, including the steps 602, 603, 604, 605, 606, and 607, that can be carried out to form the isolated symmetric diode array structure 600. Isolation trenches 609 can be patterned using, for example, a dedicated silicon nitride isolation hard mask 610, or by re-using the implant hard mask 210 as the isolation hard mask 610. Alternatively, isolation trenches 609 can be inserted between already formed asymmetric diodes instead, sacrificing the symmetric diodes, depending on the discharge function requirements.

At 602, if using a dedicated isolation hard mask 610, deposition and patterning of the isolation hard mask 610 can be accomplished using conventional techniques, consistent with those described above for use in forming the implant hard mask 210. According to an alternative embodiment, if the implant hard mask 210 has been retained, it can be used again to pattern the isolation trenches 609 in place of the isolation hard mask 610, in which case step 602 can be omitted. If necessary, a trimming step can be inserted to adjust the size and/or position of the implant hard mask 210, making it suitable for use as an isolation hard mask 610.

Figure 6B:
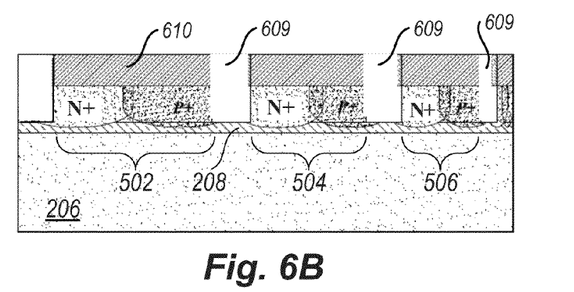
FIGS. 6B-6D are side views illustrating the process of isolating adjacent diodes, in accordance with the exemplary process flow shown in FIG. 6A.

At 603, after the isolation hard mask 610 is in place, the doped substrate can be etched to form the isolation trenches 609 as shown in FIG. 6B.

Figure 6C:
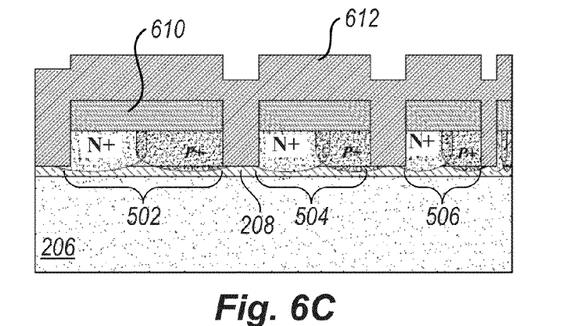

At 604, a trench oxide 612 can be conformally deposited, so as to extend over the isolation hard mask 610 and follow the profile of the isolation trenches 609, as shown in FIG. 6C.

At 605, portions of the trench oxide 612 covering the isolation hard mask 610 can be removed by planarization (CMP), stopping on the isolation hard mask 610.

At 606, the isolation hard mask 610 can be removed in a conventional hot phosphoric acid dip.

Figure 6D:
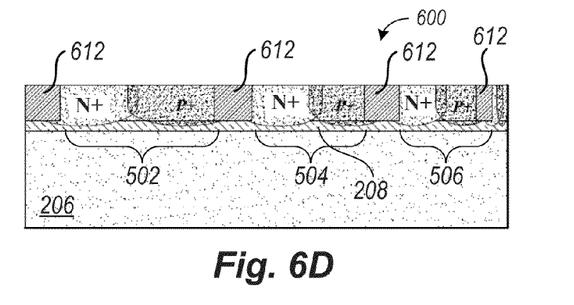

At 607, remaining trench oxide can be planarized using the doped silicon substrate as a polish stop layer, to yield the completed isolated diode array structure 600.

Figure 7A:
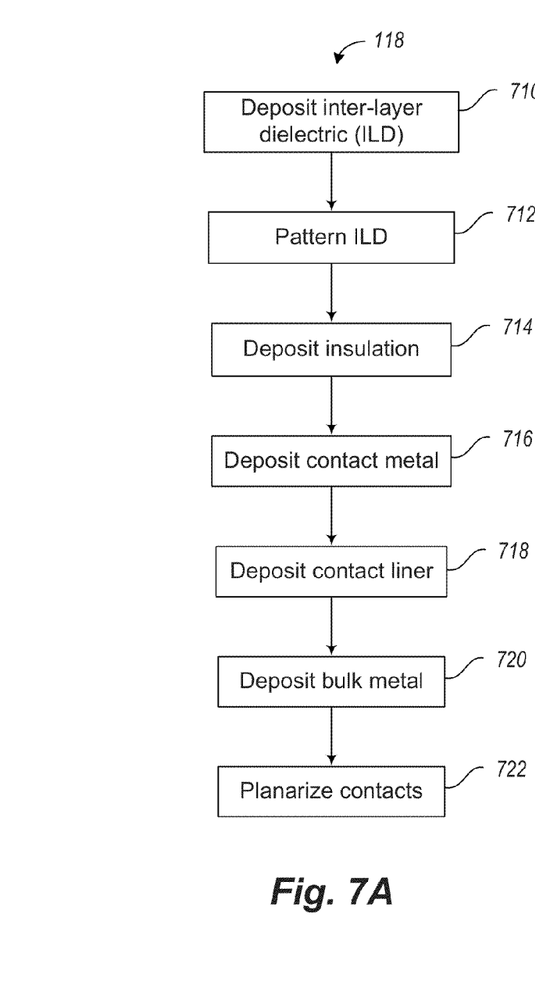
FIG. 7A is a process flow diagram showing a sequence of process steps that can be used to form contacts to a diode array for use as an electrostatic discharge device.
Figure 7B:
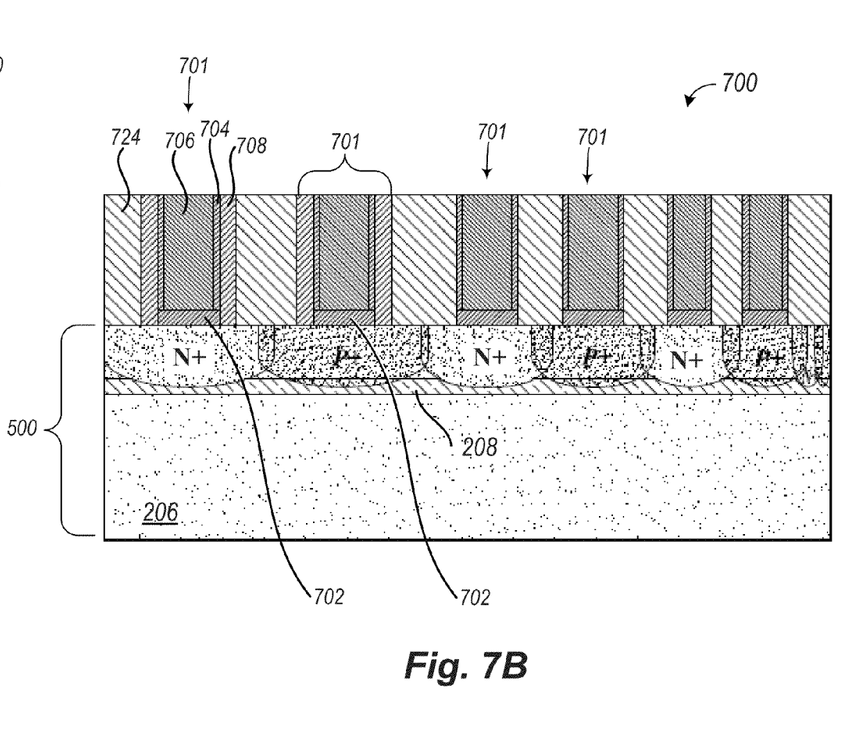
FIG. 7B is a side view of an ESD device showing a metal contact array that results from completing the process flow shown in FIG. 7A.

According to an alternative embodiment, instead of removing FIG. 7B illustrates an ESD device that includes a metal contact array 700 having metal contacts 701 that can be used to electrically access the exemplary p-n junction diode array 500. Each metal contact 701 can include, for example, a contact metal 702, a metal liner 704, a bulk metal 706, and optionally, a layer of insulation 708 that encapsulates the metal contact. It is desirable that the larger metal contacts 701 include encapsulation.

FIG. 7A shows a more detailed sequence of process steps within the step 118, including the steps 710, 712, 714, 716, 718, 720, and 722, that can be carried out to form the metal contact array 700 shown in FIG. 7B.

At 710, an inter-layer dielectric (ILD) 724, typically a thick oxide, or a dielectric material having a low dielectric constant ("low-k") of about 2.55 or less, can be deposited using conventional deposition techniques.

At 712, the ILD 724 can be patterned using conventional photolithography and via etching techniques to create contact holes exposing the doped N+ and P+ regions. A mask used to pattern the contact holes into the ILD 724 can have openings of graduated size, to substantially match the graduated widths of the doped regions. For example, the diameters of the contact holes can range from about 20 nm to about 70 nm. Thus, the metal contacts to the large doped regions can be designed to be wider than the metal contacts to the intermediate-sized doped regions and to the small doped regions.

At 714, a conformal deposition step can be performed to establish the insulation 708 in the contact holes wherever encapsulation is desired, for example, around the largest wires. If encapsulation is used only for the largest contacts as shown, an additional mask layer may be necessary. The insulating material can be, for example, silicon nitride, or a carbon nitride compound generically expressed as $C_xN_yH_z$.

At 716, the contact metal 702 such as, for example, nickel or cobalt, can be deposited at the bottom of each contact hole and allowed to react with the underlying doped silicon to form a silicide that provides an ohmic contact with each doped region.

At 718, the metal liner 704 can be deposited on the sidewalls of the contact hole, in contact with the insulation 708.

At 720, the contact hole can be filled with the bulk metal 706, for example, tungsten, copper, or alloys of such metals.

At 722, the contact fill material can be planarized by performing a CMP step using the ILD 724 as a polish stop layer.

Figure 8A:
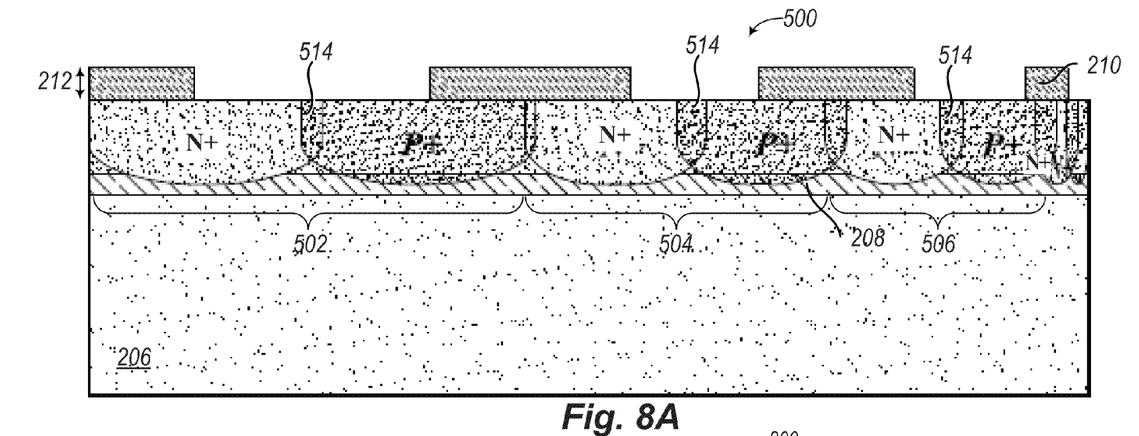
FIGS. 8A and 8B illustrate, by way of example, how variations in the implant mask pattern can be used to create p-n junction diode arrays of different densities.
Figure 8B:
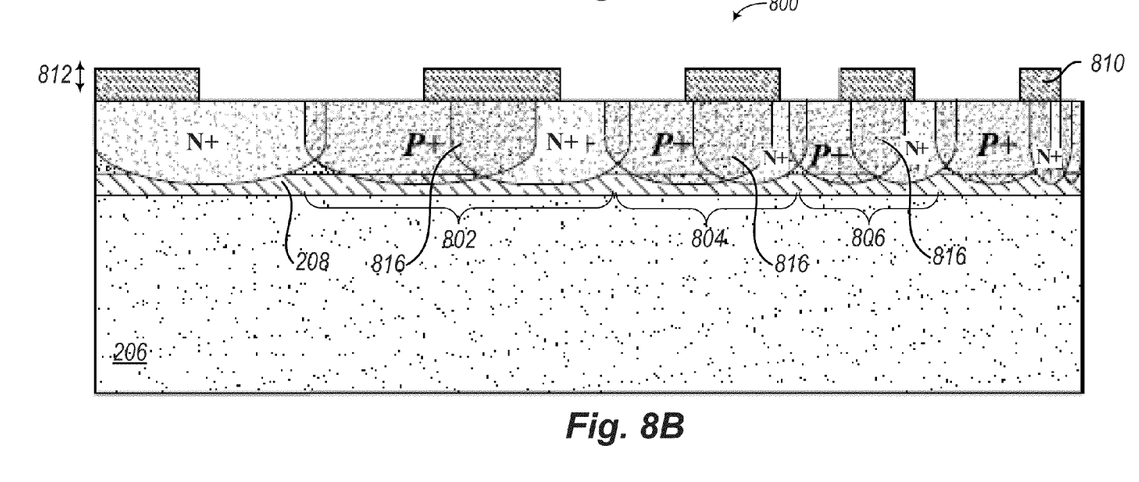

FIG. 8A reproduces the exemplary diode array 500 as a low density array in which the large symmetric diode 502, the intermediate-sized symmetric diode 504, and the small symmetric diode 506 are illustrated for comparison with FIG. 8B. The overlap regions (symmetric diode junctions) 514 have similar widths, regardless of the sizes of the doped regions. Furthermore, the symmetric diode junction widths are small compared to the width of each doped region.

FIG. 8B shows an exemplary high-density diode array 800, created using a high-density mask 810, having a thickness 812, in which a large asymmetric diode 802, an intermediate-sized asymmetric diode 804, and a small asymmetric diode 806 are illustrated. The overlap regions (asymmetric diode junctions) 816 have different widths, which scale with the sizes of the overall diodes. In the high-density diode array 800, the asymmetric diode junctions 816 are also significantly larger than in the low-density case, such that the junction widths can approach approximately half the width of the doped regions.

Figure 9:
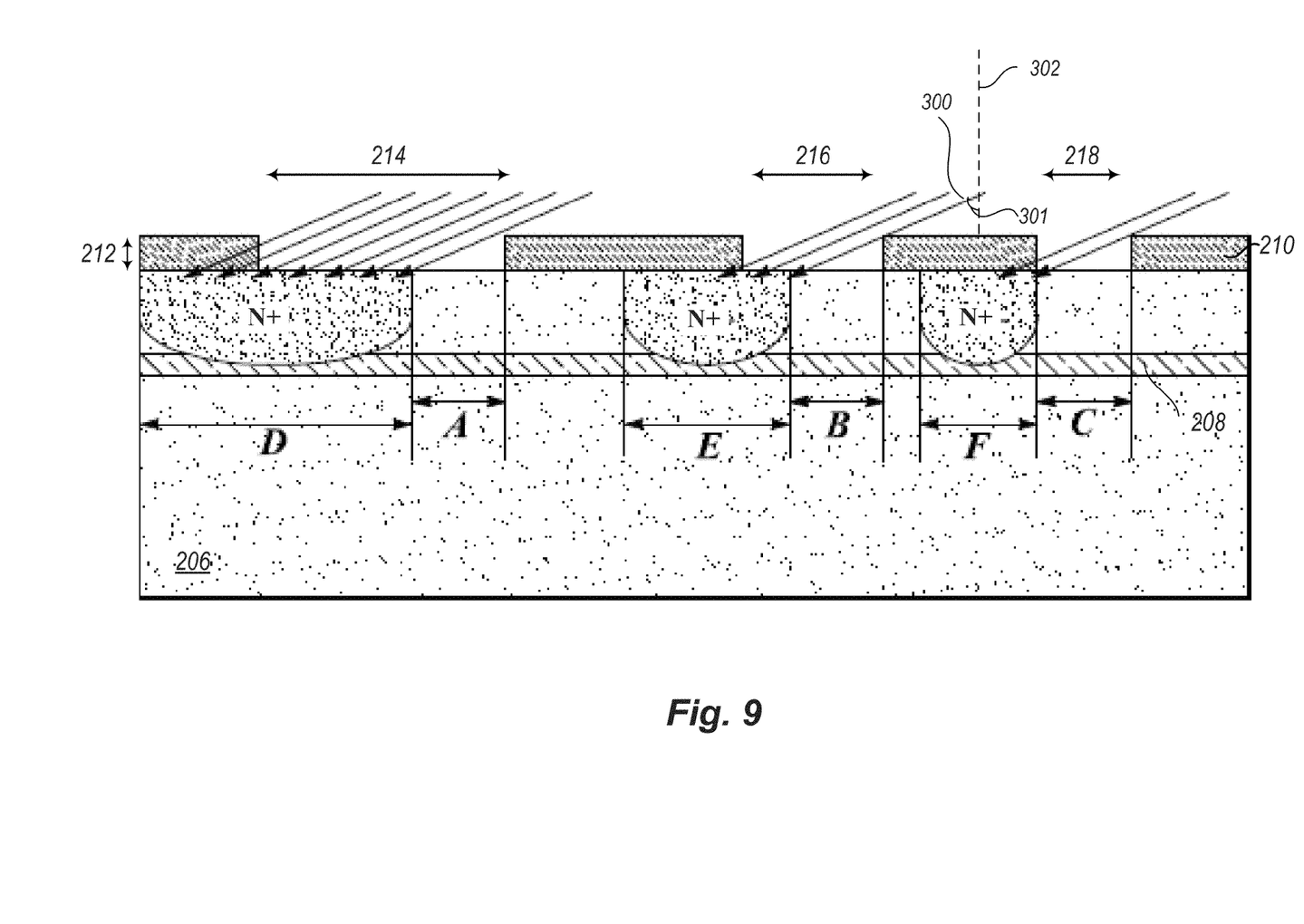
FIG. 9 illustrates, by way of example, the influence of implant angle, mask thickness, and implant mask design in establishing dimensions of ESD diode arrays.
Figure 10:
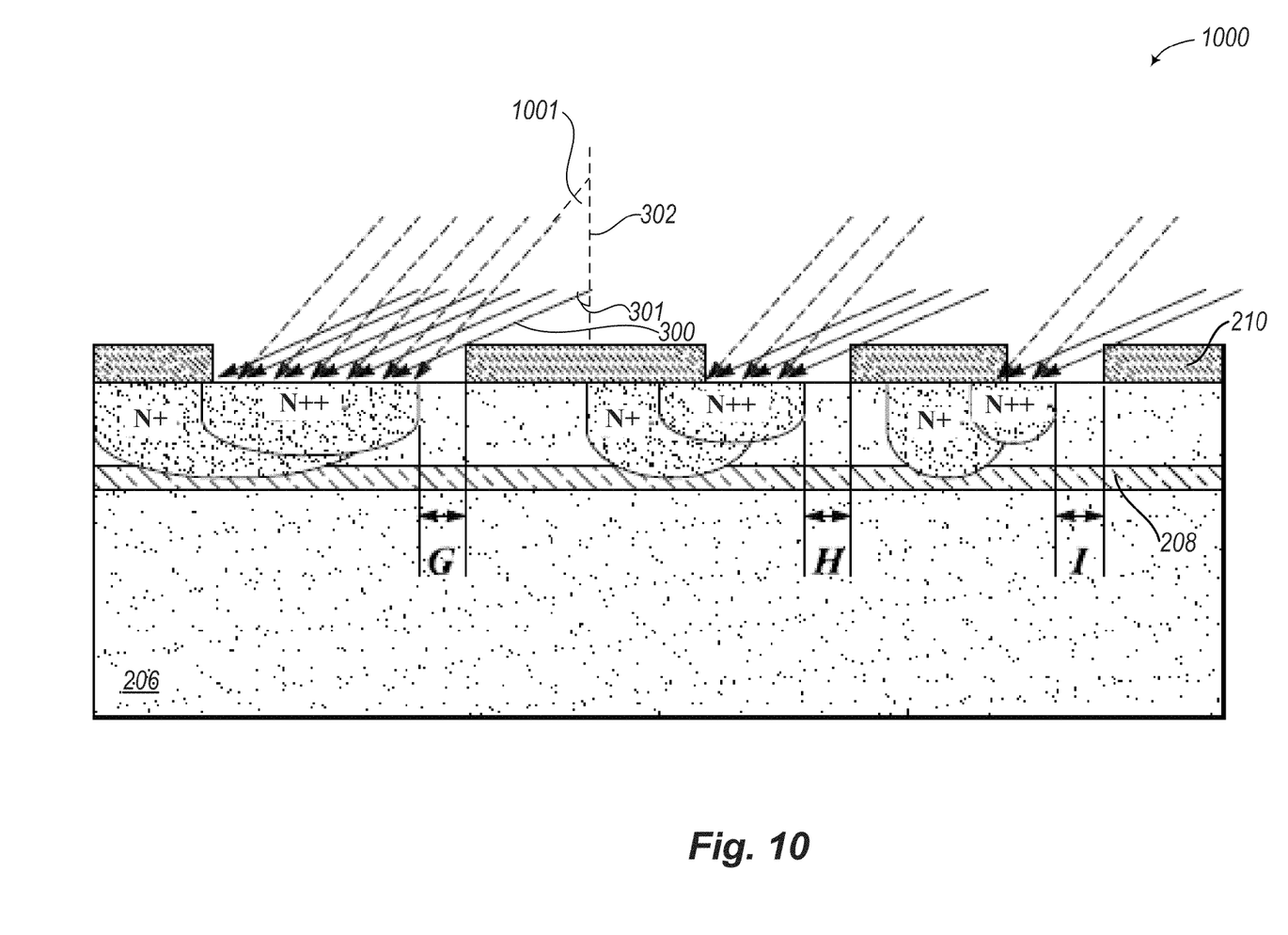
FIG. 10 shows an array of diodes that can be created by varying implant angles for different species of dopants, according to one embodiment.

It is also possible, as shown in FIGS. 9 and 10, to create an array of N+/N++ diodes 1000, in which the diode junctions include different concentrations of negative dopants (e.g., slightly negatively doped (N+), and strongly negatively doped (N++) regions,) as opposed to the usual p-n junctions.

FIG. 9 shows, by way of example, how the sizes of the N+ regions can be tuned by selection of the selected implant angles 301 and 401, and the implant hard mask thickness 212. Distances A, B, and C between the edge of the implant hard mask 210 and the edge of the doped N+ regions are substantially fixed, these dimensions being determined by selection of the implant angles and the implant hard mask thickness 212, whereas the N+ implant region widths D, E, and F are further determined by the sizes of the graduated mask openings, e.g., 214, 216, and 218. Hence, the widths D, E, and F are also graduated.

To create an N+/N++ junction, high-concentration N++ regions can be doped as shown in FIG. 10. In this example, a slightly different implant angle 1001 than the selected implant angle 301 is used to implant N+ ions. Again, the distances G, H, and I, between the edge of the doped regions and the hard mask, are substantially constant, and independent of the sizes of the mask openings. FIG. 10 also shows that, for a given implant energy, the implant angle influences the implant depth. For example, the shallower N+ implant trajectory specified by the implant angle 301 drives the N+ dopants deeper into the silicon substrate 206 than does the steeper N++ trajectory specified by the implant angle 1001.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

It will be appreciated that, although specific embodiments of the present disclosure are described herein for purposes of illustration, various modifications may be made without departing from the spirit and scope of the present disclosure. Accordingly, the present disclosure is not limited except as by the appended claims.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. An electrostatic discharge device for integrated circuits, the electrostatic discharge device comprising:
    a silicon substrate;
    a first symmetric junction diode formed in the silicon substrate, the first symmetric junction diode configured to provide low voltage and current discharge via unencapsulated interconnecting wires;
    a second symmetric junction diode formed in the silicon substrate, the second symmetric junction diode configured to provide high voltage and current discharge via encapsulated interconnecting wires; and
    electrical contacts to the junction diodes.

2. The electrostatic discharge device of claim 1, wherein the first symmetric junction diode has a first width, and the second symmetric junction diode has a second width that exceeds the first width.

3. The electrostatic discharge device of claim 2, wherein the first and second symmetric junction diodes are p-n junction diodes, and further comprising a third, asymmetric, p-n junction diode formed from a portion of the first symmetric junction diode and an oppositely-charged portion of the second symmetric junction diode.

4. The electrostatic discharge device of claim 1, further comprising a buried oxide layer within the silicon substrate.

5. The electrostatic discharge device of claim 4 wherein one or more of the junction diodes extends to the buried oxide layer.

6. The electrostatic discharge device of claim 1 wherein widths of the electrical contacts scale with the widths of associated junction diodes.

7. The electrostatic discharge device of claim 1, wherein the encapsulated interconnecting wires are encapsulated by an insulating material that includes one or more of silicon nitride (SiN) or a carbon nitride compound ($C_xN_yH_z$).

8. The electrostatic discharge device of claim 1, further comprising isolation regions formed between the junction diodes.

9. The electrostatic discharge device of claim 1 wherein at least some of the junction diodes are $N^+/N^{++}$ junction diodes.

10. A diode array for use in discharging static electricity in integrated circuits, the diode array comprising:
    a silicon substrate;
    a first array of doped regions of the silicon substrate, the first array of doped regions having graduated widths and containing a first dopant species,
    a second array of doped regions of the silicon substrate, the second array of doped regions having graduated widths and containing a second dopant species, the second array interleaved with the first array so that pairs of adjacent doped regions overlap to form diode junctions, each diode junction characterized by an overlap width; and
    an array of interconnects providing access to couple electrical signals to the diode array.

11. The diode array of claim 10, further comprising a buried oxide layer within the silicon substrate.

12. The diode array of claim 11, wherein the buried oxide layer presents a diffusion barrier that determines a depth of the doped regions.

13. The diode array of claim 10, wherein the overlap widths of the diode junctions are at least partly determined by a set of ion implantation process parameters.

14. The diode array of claim 13, wherein the set of ion implantation process parameters includes an implant angle and an implant energy intensity.

15. The diode array of claim 10, wherein the graduated widths of the first array of doped regions substantially match the graduated widths of the second array of doped regions.

16. The diode array of claim 10, wherein the diode array has a diode density that is at least partly determined by a set of ion implantation process parameters.

17. The diode array of claim 16 wherein the set of ion implantation processing parameters includes an implant angle and an implant energy intensity.

18. The diode array of claim 10, wherein the first dopant species is n-type, the second dopant species is p-type, and further comprising isolation regions between the pairs of adjacent n- and p-doped regions.

* * * * *